(12) United States Patent
Han et al.

(10) Patent No.: US 7,880,501 B2
(45) Date of Patent: Feb. 1, 2011

(54) INTEGRATED CIRCUIT DEVICES HAVING LEVEL SHIFTING CIRCUITS THEREIN

(75) Inventors: Hee-Seok Han, Gyeonggi-do (KR); Hyoung-Rae Kim, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 12/486,176

(22) Filed: Jun. 17, 2009

(65) Prior Publication Data

US 2009/0315610 A1 Dec. 24, 2009

(30) Foreign Application Priority Data

Jun. 24, 2008 (KR) .................. 10-2008-0059521

(51) Int. Cl.
*H03K 19/175* (2006.01)

(52) U.S. Cl. ...................................... 326/68

(58) Field of Classification Search .............. 326/62, 326/63, 68, 80–81; 327/333
See application file for complete search history.

(56) References Cited

U.S. PATENT DOCUMENTS

| | | | | |
|---|---|---|---|---|
| 5,510,731 A | * | 4/1996 | Dingwall | ......... 326/63 |
| 6,043,699 A | * | 3/2000 | Shimizu | ......... 327/333 |
| 7,167,018 B1 | * | 1/2007 | Wu et al. | ......... 326/26 |
| 2004/0160262 A1 | * | 8/2004 | Kim et al. | ......... 327/333 |

FOREIGN PATENT DOCUMENTS

| | | |
|---|---|---|
| JP | 08-330939 | 12/1996 |
| JP | 2000-278112 | 10/2000 |
| KR | 10-2006-0066365 A | 6/2006 |

\* cited by examiner

*Primary Examiner*—Rexford N Barnie
*Assistant Examiner*—Thienvu V Tran
(74) *Attorney, Agent, or Firm*—Myers Bigel Sibley & Sajovec (57) ABSTRACT

Level shifting circuits generate multiple tracking signals that are in-phase with an input signal, but are also level-shifted with wider voltage swings relative to the input signal. These input tracking signals are provided as separate inputs to an inverter having at least one PMOS pull-up transistor and at least one NMOS pull-down transistor therein. A level shifting circuit may include a differential input circuit, which is responsive to true and complementary input signals. A first load circuit is electrically coupled to the differential input circuit. This first load circuit is configured to generate first and second tracking signals at respective first and second nodes therein. These first and second tracking signals are in-phase, level-shifted versions of each other, and have respective voltage swings that are greater than a voltage swing of the complementary input signals. The inverter includes a pull-up transistor responsive to the first tracking signal and a pull-down transistor responsive to the second tracking signal.

10 Claims, 6 Drawing Sheets

INTEGRATED CIRCUIT DEVICES HAVING LEVEL SHIFTING CIRCUITS THEREIN

CROSS REFERENCE TO RELATED APPLICATION

This application claims priority under 35 USC §119 to Korean Patent Application No. 10-2008-0059521, filed on Jun. 24, 2008, the disclosure of which is hereby incorporated herein by reference in its entirety as if set forth fully herein.

BACKGROUND

The present invention relates to integrated circuit devices and, more particularly, to integrated circuit devices having level shifting circuits therein.

Generally, hand-held devices, such as portable multimedia players (PMP) and mobile phones typically use mobile thin-film transistors (TFT) liquid crystal displays (LCD). These hand-held devices typically use a secondary battery that is rechargeable such as lithium-ion battery. The second battery has a limited power, and thus it is important to reduce power consumption in the hand-held device. In addition, as an amount of data processed by the hand-held device abruptly increases, a power consumption of an LCD driving integrated circuit (IC) for processing the data in the hand-held device also increases.

SUMMARY

Integrated circuit devices according to embodiments of the invention include level shifting circuits configured to generate multiple tracking signals that are in-phase with an input signal, but level-shifted with wider swings relative to the input signal. These input tracking signals are provided as separate inputs to an inverter having at least one PMOS pull-up transistor and at least one NMOS pull-down transistor therein. According to some of these embodiments of the invention, a level shifting circuit includes a differential input circuit, which is responsive to true and complementary input signals. A first load circuit is electrically coupled to the differential input circuit. This first load circuit is configured to generate first and second tracking signals at respective first and second nodes therein. These first and second tracking signals are in-phase, level-shifted versions of each other, and have respective voltage swings that are greater than a voltage swing of the complementary input signals. An inverter may also be provided. This inverter has a pull-up transistor therein that is responsive to the first tracking signal. The inverter may also have a pull-down transistor responsive to the second tracking signal.

According to additional embodiments of the invention, the differential input circuit includes first and second input transistors having gate terminals responsive to the true and complementary input signals, respectively. The first load circuit may also include first and second pairs of cross-coupled load transistors electrically connected to drain terminals of the first and second input transistors in the differential input circuit. According to some of these embodiments of the invention, the first pair of cross-coupled load transistors includes a totem pole arrangement of a first load transistor configured as a diode and a second load transistor having a drain terminal connected to a source terminal of the first load transistor. Similarly, the second pair of cross-coupled load transistors may include a totem pole arrangement of a third load transistor configured as a diode and a fourth load transistor having a drain terminal connected to a source terminal of the third load transistor. According to this configuration, the gate terminals of the first and fourth load transistors are electrically connected together and the gate terminals of the second and third load transistors are electrically connected together. Moreover, the inverter may include a pull-down transistor responsive to the second tracking signal. In some of these embodiments, the first and second tracking signals are generated at the source and drain terminals of the first load transistor, respectively.

According to still further embodiments of the invention, a second load circuit is provided in addition to the first load circuit. This second load circuit is electrically coupled to the differential input circuit. The second load circuit is configured to generate third and fourth tracking signals at respective third and fourth nodes therein. These third and fourth tracking signals, which are in-phase, level-shifted versions of each other, have respective voltage swings that are greater than a voltage swing of the complementary input signals. In the event the second load circuit is provided, then the inverter may include a pull-down transistor that is responsive to the third tracking signal. The second load circuit, which is electrically coupled to the differential input circuit, may have a complementary configuration relative to the first load circuit. Based on this complementary configuration, the first load circuit may consist of two pairs of PMOS (or NMOS) transistors and the second load circuit may consist of two pairs of NMOS (or PMOS) transistors.

According to additional embodiments of the invention, an integrated circuit device includes a differential input circuit, which is responsive to true and complementary input signals, and a load circuit electrically coupled to the differential input circuit. The load circuit is configured to generate first and second tracking signals at respective first and second nodes therein. These first and second tracking signals may be generated as in-phase, level-shifted versions of each other and may have respective voltage swings that are greater than a voltage swing of the true input signal. The integrated circuit device also includes an inverter having a pull-up transistor and pull-down transistor therein that are responsive to the first tracking signal and the second tracking signal, respectively. An output of this inverter is provided to a charge pump regulator within a device, such as a liquid crystal display device. According to these embodiments of the present invention, the differential input circuit includes a first pair of NMOS input transistors responsive to the true and complementary input signals and a second pair of PMOS input transistors responsive to the true and complementary input signals. The load circuit also includes a first load circuit electrically coupled to the first pair of NMOS input transistors and a second load circuit electrically coupled to the second pair of PMOS input transistors. These first and second load circuits are configured to generate the first and second tracking signals, respectively.

BRIEF DESCRIPTION OF THE DRAWINGS

Illustrative, non-limiting example embodiments will be more clearly understood from the following detailed description taken in conjunction with the accompanying drawings.

DETAILED DESCRIPTION OF THE EMBODIMENTS

Various example embodiments will be described more fully hereinafter with reference to the accompanying drawings, in which some example embodiments are shown. The present invention may, however, be embodied in many different forms and should not be construed as limited to the example embodiments set forth herein. Rather, these example embodiments are provided so that this disclosure will be thorough and complete, and will fully convey the scope of the present invention to those skilled in the art. In the drawings, the sizes and relative sizes of layers and regions may be exaggerated for clarity. Like numerals refer to like elements throughout.

It will be understood that, although the terms first, second, third etc. may be used herein to describe various elements, these elements should not be limited by these terms. These terms are used to distinguish one element from another. Thus, a first element discussed below could be termed a second element without departing from the teachings of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular example embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
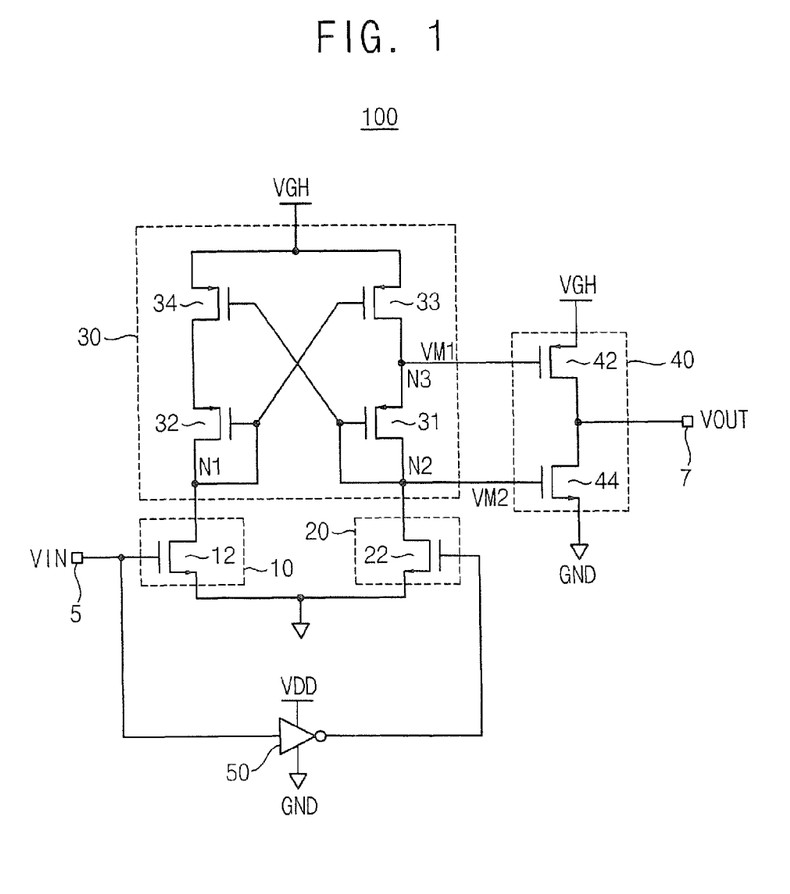
FIG. 1 is a circuit diagram illustrating a level shifting circuit according to some example embodiments.

FIG. 1 is a circuit diagram illustrating a level shifting circuit according to some example embodiments. Referring to FIG. 1, a level shifting circuit 100 includes an input unit 10, a pull-down driving unit 20, a level converting unit 30, and an output unit 40. The level shifting circuit 100 may further include an inverter 50.

The input unit 10 includes a first n-type metal oxide semiconductor (NMOS) transistor 12, and the pull-down driving unit 20 includes a second NMOS transistor 22. The level converting unit 30 includes first through fourth p-type MOS (PMOS) transistors 31, 32, 33, and 34. The output unit 40 includes a fifth PMOS transistor 42 and a third NMOS transistor 44. The input unit 10 is coupled between a first node N1 and a ground voltage GND. The pull-down driving unit 20 is coupled between a second node N2 and the ground voltage GND. The level converting unit 30 is coupled between a first power supply voltage VGH, the first node N1, and the second node N2. The output unit 40 is coupled between the first power supply voltage VGH and the ground voltage GND.

The first NMOS transistor 12 has a gate coupled to an input terminal 5, a source coupled to the ground voltage GND and a drain coupled to the first node N1. The second NMOS transistor 22 has a gate coupled to an output terminal of the inverter 50, a source coupled to the ground voltage GND and a drain coupled to the second node N2. The first PMOS transistor 31 has a gate and a drain coupled to the second node N2 and a source coupled to a third node N3. That is, the first PMOS transistor 31 is diode-connected. The second PMOS transistor 32 has a gate and a drain coupled to the first node N1. That is, the second PMOS transistor 32 is diode-connected. The third PMOS transistor 33 has a drain coupled to the third node N3, a gate coupled to the first node N1, and a source coupled to the first power supply voltage VGH. The fourth PMOS transistor 34 has a drain coupled to a source of the second PMOS transistor 32, a gate coupled to the second node N2, and a source coupled to the first power supply voltage VGH. The fifth PMOS transistor 42 has a source coupled to the first power supply voltage VGH, a gate coupled to the third node N3, and a drain coupled to an output terminal 7. The third NMOS transistor 44 has a drain coupled to the output terminal 7, a gate coupled to the second node N2, and a source coupled to the ground voltage GND.

Figure 2:
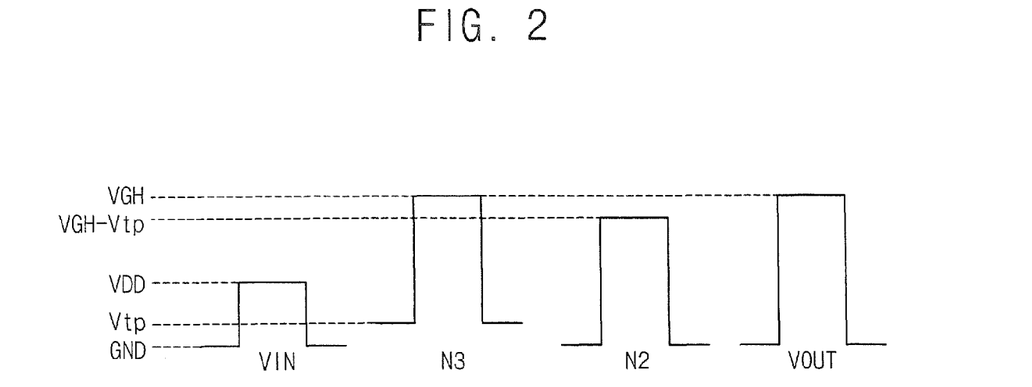
FIG. 2 illustrates voltage levels of various signals of the level shifting circuit of FIG. 1.

FIG. 2 illustrates voltage levels of various signals of the level shifting circuit of FIG. 1. In FIG. 2, an input signal VIN is applied to the input terminal 5, a first intermediate voltage signal VM1 is provided at the third node N3, a second intermediate voltage signal VM2 is provided at the second node N2, and an output signal VOUT is provided at the output terminal 7.

Referring to FIGS. 1 and 2, the input signal VIN may be a pulse signal or a clock signal that swings between a first voltage level (ground voltage) and a second voltage level (VDD). The second voltage level (VDD) is a voltage that is enough to turn on the first NMOS transistor 10. An inverted input signal through the inverter 50 is applied to the gate of the second NMOS transistor 22. When a voltage level of the input signal VIN corresponds to VDD, the first NMOS transistor 12 of the input unit 10 is turned on, and a voltage level of the first node N1 corresponds to GND. When the first NMOS transistor 12 is turned on, the second NMOS transistor 22 of the pull-down driving unit 20 is turned off. Because the voltage level of the first node N1 corresponds to GND, the second and third PMOS transistors 32 and 33 are turned on. When the third PMOS transistor 33 is turned on, the voltage level of the third node N3 transitions to VGH level. That is, a voltage level of the first intermediate voltage signal VM1 provided at the third node N3, corresponds to the VGH level. At this time, the first PMOS transistor 31 operates as a forward-biased diode, because the first PMOS transistor 31 is diode-connected. Accordingly, a voltage level of the second node N2 corresponds to a voltage level that equals VGH minus a threshold voltage (Vtp) of the first PMOS transistor 31.

When the voltage level of the input signal VIN corresponds to GND, the first NMOS transistor 12 is turned off, the second NMOS transistor 22 is turned on, and the voltage level of the second node N2 transitions to GND. When the voltage level of the second node N2 transitions to GND, the first PMOS transistor 31 is turned on, and the voltage level of the third node N3 is lowered. Because the first PMOS transistor 31 is diode-connected, the voltage level of the third node N3 is higher than the voltage level of the second node N2 by the threshold voltage (Vtp) of the first PMOS transistor 31.

The first and second intermediate voltage signals VM1 and VM2 are respectively provided to the gates of fifth PMOS transistor 42 and the third NMOS transistor 44 of the output unit 40. Therefore, there is provided the output signal VOUT swinging between GND and VGH at the output terminal 7. Because the first and second intermediate voltage signals VM1 and VM2 are respectively provided to fifth PMOS transistor 42 and the third NMOS transistor 44 of the output unit 40, leakage current of the output unit 40 may be prevented because of the voltage levels of first and second intermediate voltage signals VM1 and VM2, and thus power consumption may be reduced.

When the input signal swings between GND (the first voltage level) and VDD (the second voltage level), the first intermediate voltage signal VM1, which is provided at the third node N3, swings between GND+Vtp (a fourth voltage level) and VGH (a third voltage level), and the second intermediate voltage signal VM2, which is provided at the second node N2, swings between GND (the first voltage level) and VGH−Vtp (a fifth voltage level). Because the first intermediate voltage signal VM1 swings between GND+Vtp and VGH, the fifth PMOS transistor 42 may be fully turned off. In addition, because the second intermediate voltage signal VM2 swings between GND and VGH−Vtp, the third NMOS transistor 44 may be fully turned off. Therefore, leakage current of the output unit 40 may be prevented. When the first intermediate voltage signal VM1 is simultaneously applied to gates of the fifth PMOS transistor 42 and the third NMOS transistor 44, while the fifth PMOS transistor 42 is turned on, the third NMOS transistor 44 is not fully turned off. Therefore, leakage current may occur in the output unit 40. When the second intermediate voltage signal VM2 is simultaneously applied to gates of the fifth PMOS transistor 42 and the third NMOS transistor 44, while the third NMOS transistor 44 is turned on, the fifth PMOS transistor 42 is not fully turned off. Therefore, leakage current may occur in the output unit 40. The level shifting circuit 100 of FIG. 1 may be implemented with other circuit elements.

Figure 3:
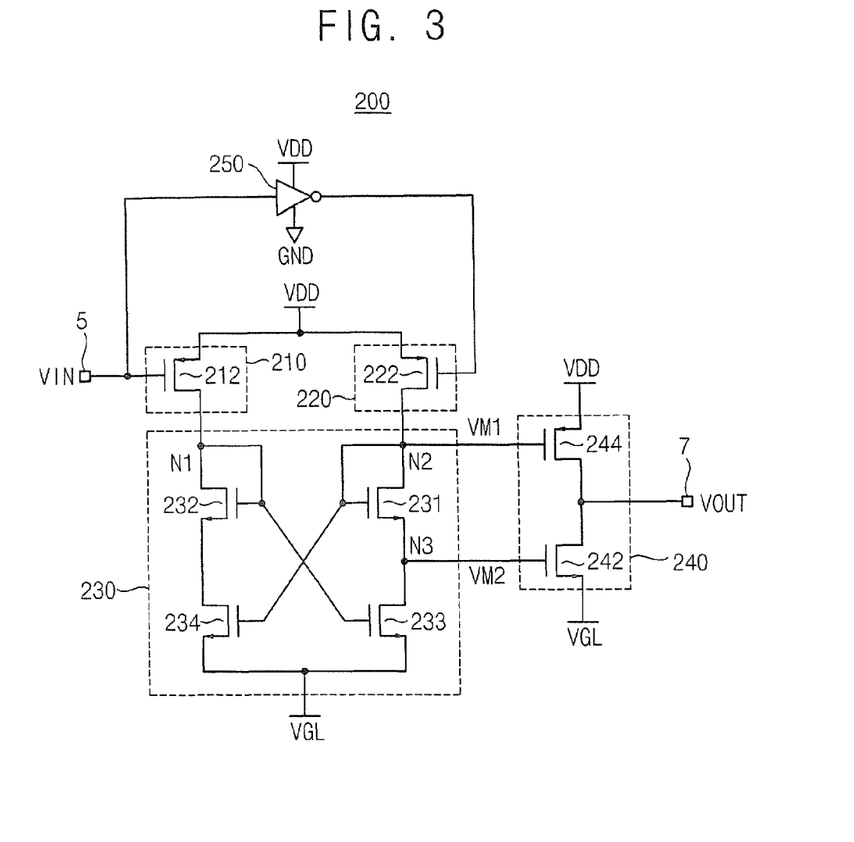
FIG. 3 is a circuit diagram illustrating a level shifting circuit according to other example embodiments.

FIG. 3 is a circuit diagram illustrating a level shifting circuit according to other example embodiments. Referring to FIG. 3, a level shifting circuit 200 includes an input unit 210, a pull-up driving unit 220, a level converting unit 230, and an output unit 240. The level shifting circuit 200 may further include an inverter 250.

The input unit 210 includes a first PMOS transistor 212, and the pull-up driving unit 220 includes a second PMOS transistor 222. The level converting unit 230 includes first through fourth NMOS transistors 231, 232, 233, and 234. The output unit 240 includes a third PMOS transistor 242 and a fifth NMOS transistor 244. The input unit 210 is coupled between a first node N1 and a first power supply voltage VDD. The pull-up driving unit 220 is coupled between a second node N2 and the first power supply voltage VDD. The level converting unit 230 is coupled between a first power supply voltage VGH, the first node N1, and the second node N2. The output unit 240 is coupled between the first power supply voltage VDD and a second power supply voltage VGL. A voltage level of the first power supply voltage VDD is higher than the ground voltage GND, and a voltage level of the second power supply voltage VGL is lower than the ground voltage GND.

The first PMOS transistor 212 has a gate coupled to an input terminal 5, a source coupled to the first power supply voltage VDD and a drain coupled to the first node N1. The second PMOS transistor 222 has a gate coupled to an output terminal of the inverter 250, a source coupled to the first power supply voltage VDD and a drain coupled to the second node N2. The first NMOS transistor 231 has a gate and a drain coupled to the second node N2 and a source coupled to a third node N3. That is, the first NMOS transistor 231 is diode-connected. The second NMOS transistor 232 has a gate and a drain coupled to the first node N1. That is, the second NMOS transistor 232 is diode-connected. The third NMOS transistor 233 has a drain coupled to the third node N3, a gate coupled to the first node N1, and a source coupled to the second power supply voltage VGL. The fourth NMOS transistor 234 has a drain coupled to a source of the second NMOS transistor 232, a gate coupled to the second node N2, and a source coupled to the second power supply voltage VGL. The fifth NMOS transistor 242 has a source coupled to the second power supply voltage VGL, a gate coupled to the third node N3, and a drain coupled to an output terminal 7. The third PMOS transistor 244 has a drain coupled to the output terminal 7, a gate coupled to the second node N2, and a source coupled to the first power supply voltage VDD.

Figure 4:
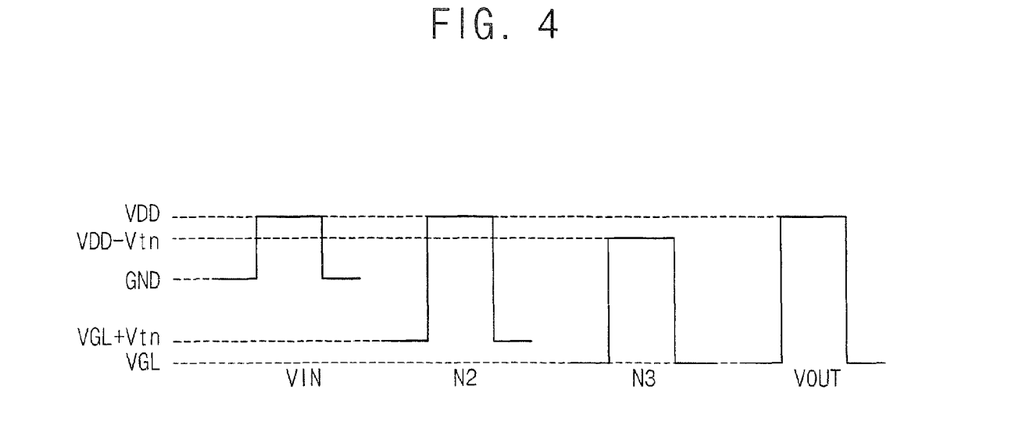
FIG. 4 illustrates voltage levels of various signals of the level shifting circuit of FIG. 3.

FIG. 4 illustrates voltage levels of various signals of the level shifting circuit of FIG. 3. In FIG. 4, an input signal VIN is applied to the input terminal 5, a first intermediate voltage signal VM1 is provided at the second node N2, a second intermediate voltage signal VM2 is provided at the third node N3, and an output signal VOUT is provided at the output terminal 7.

Referring to FIGS. 3 and 4, the input signal VIN may be a pulse signal or a clock signal that swings between a first voltage level (ground voltage) and a second voltage level (VDD). An inverted input signal through the inverter 250 is applied to the gate of the second PMOS transistor 222. When a voltage level of the input signal VIN corresponds to GND, the first PMOS transistor 212 of the input unit 210 is turned on, and a voltage level of the first node N1 corresponds to VDD. When the first PMOS transistor 212 is turned on, the second PMOS transistor 222 of the pull-up driving unit 220 is turned off. Because the voltage level of the first node N1 corresponds to VDD, the second and third NMOS transistors 232 and 233 are turned on. When the third NMOS transistor 233 is turned on, the voltage level of the third node N3 transitions to VGL level. That is, a voltage level of the second intermediate voltage signal VM2 provided at the third node N3, corresponds to the VGL level. At this time, the first NMOS transistor 231 operates as a forward0 biased diode, because the first NMOS transistor 231 is diode-connected. Accordingly, a voltage level of the second node N2 corresponds to a voltage level that equals VGL plus a threshold voltage (Vtn) of the first NMOS transistor 231.

When the voltage level of the input signal VIN corresponds to VDD, the first PMOS transistor 212 is turned off, the second PMOS transistor 222 is turned on, and the voltage level of the second node N2 transitions to VDD. When the voltage level of the second node N2 transitions to VDD, the first NMOS transistor 231 is turned on, and the voltage level of the third node N3 is heightened. Because the first NMOS transistor 231 is diode-connected, the voltage level of the third node N3 is lower than the voltage level of the second node N2 by the threshold voltage (Vtn) of the first NMOS transistor 231.

When the input signal swings between GND (the first voltage level) and VDD (the second voltage level), the first intermediate voltage signal VM1, provided at the second node N2, swings between VGL+Vtn and VDD, and the second intermediate voltage signal VM2, provided at the third node N3, swings between VGL and VDD−Vtn.

The first and second intermediate voltage signals VM1 and VM2 are respectively provided to the gates of third PMOS transistor 42 and the third NMOS transistor 44 of the output unit 40. Therefore, there is provided the output signal VOUT swinging between VGL and VDD at the output terminal 7. Because the first and second intermediate voltage signals VM1 and VM2 are respectively provided to third PMOS transistor 244 and the fifth NMOS transistor 242 of the output unit 240, leakage current of the output unit 240 may be prevented because of the voltage levels of first and second intermediate voltage signals VM1 and VM2, and current consumption may be reduced. Because the first intermediate voltage signal VM1 swings between VGL+Vtn and VDD, the third PMOS transistor 244 may be fully turned off. In addition, because the second intermediate voltage signal VM2 swings between VGL and VDD−Vtn, the fifth NMOS transistor 242 may be fully turned off. Therefore, leakage current of the output unit 40 may be prevented.

Figure 5:
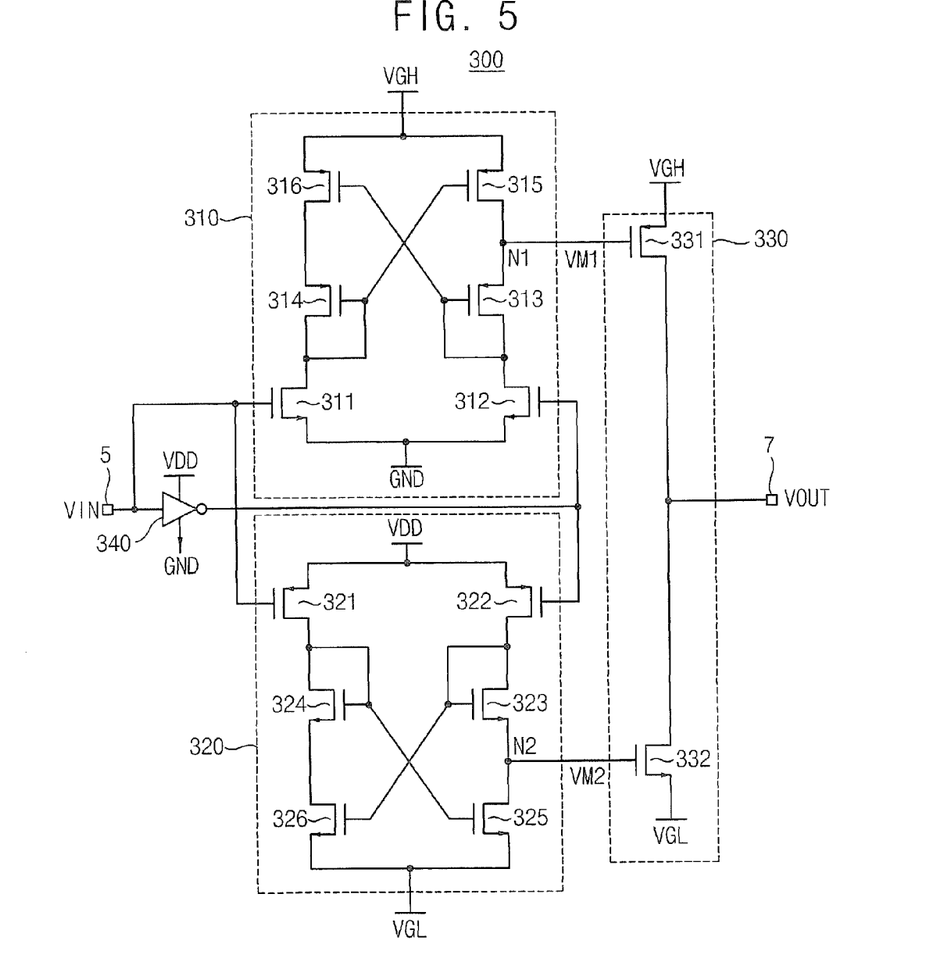
FIG. 5 is a circuit diagram illustrating a level shifting circuit according to other example embodiments.

FIG. 5 is a circuit diagram illustrating a level shifting circuit according to other example embodiments. Referring to FIG. 5, a level shifting circuit 300 includes a first level converting unit 310, a second level converting unit 320 and an output unit 330. The level shifting circuit 300 may further include an inverter 340.

The first level converting unit 310 includes first and second NMOS transistors 311, and 312, and first through fourth PMOS transistors 311, 312, 313, and 314. The second level converting unit 320 includes fifth and sixth NMOS transistors 321, and 322, and third through sixth NMOS transistors 323, 324, 325, and 326. The output unit 330 includes a seventh PMOS transistor 331 and a seventh NMOS transistor 332.

The first level converting unit 310 receives an input signal VIN an inverted signal of the input signal VIN (inverted input signal) through the inverter 340. The input signal swings between the ground voltage (GND) and a first power supply voltage (VDD). The first level converting unit 310 is coupled to GND and a second power supply voltage VGH. The second level converting unit 320 receives the input signal VIN and the inverted input signal. The second level converting unit is coupled between VDD and a third power supply voltage (VGL). A voltage level of VDD is higher than a voltage level of GND, VGH is higher than VDD, and VGL is lower than GND.

A structure and operations of the first level converting unit 310 is similar with a structure and operations of the level shifting circuit 100 of FIG. 1, and a structure and operations of the second level converting unit 320 is similar with a structure and operations of the level shifting circuit 200 of FIG. 2. Therefore, repeated description of the first and second level converting units 310 and 320 will be omitted.

Figure 6:
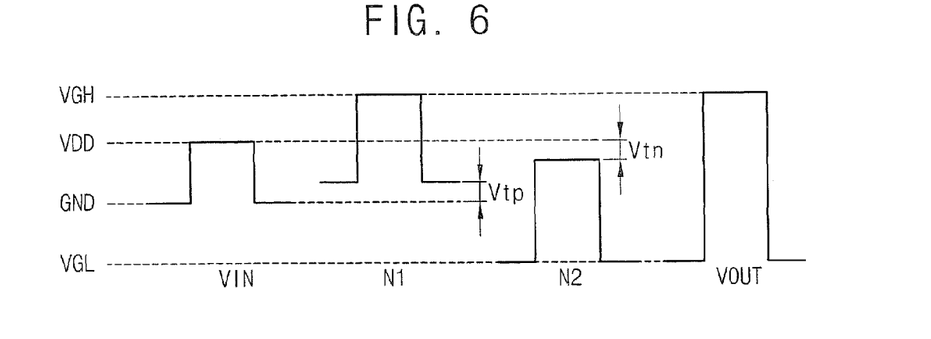
FIG. 6 illustrates voltage levels of various signals of the level shifting circuit of FIG. 5.

FIG. 6 illustrates voltage levels of various signals of the level shifting circuit of FIG. 5. When the input signal VIN swings between GND and VDD, a first intermediate voltage signal VM1 swinging between GND+Vtp (Vtp is a threshold voltage of the PMOS transistor 313) and VGH is provided at a first node N1, and a second intermediate voltage signal VM2 swinging between VGL and VDD−Vtn (Vtn is a threshold voltage of NMOS transistor 323) is provided at a second node N2. The first and second intermediate voltage signals VM1 and VM2 are respectively provided to seventh PMOS transistor 331 and the seventh NMOS transistor 332 of the output unit 330. The output signal VOUT swinging between VGL and VGH is provided at an output terminal 7.

Because the first intermediate voltage signal VM1 swings between GND+Vtp and VGH, the seventh PMOS transistor 331 may be fully turned off. In addition, because the second intermediate voltage signal VM2 swings between VGL and VDD−Vtn, the seventh NMOS transistor 332 may be fully turned off. Therefore, leakage current of the output unit 40 may be prevented. In addition, the first level converting unit 310 and the second level converting unit 320 respectively shift the high and low levels of the output signal VOUT, thereby reducing power consumption. Level shifting circuits of FIGS. 1, 3, and 5 according to example embodiments may be applicable to various fields where level converting is required.

Figure 7:
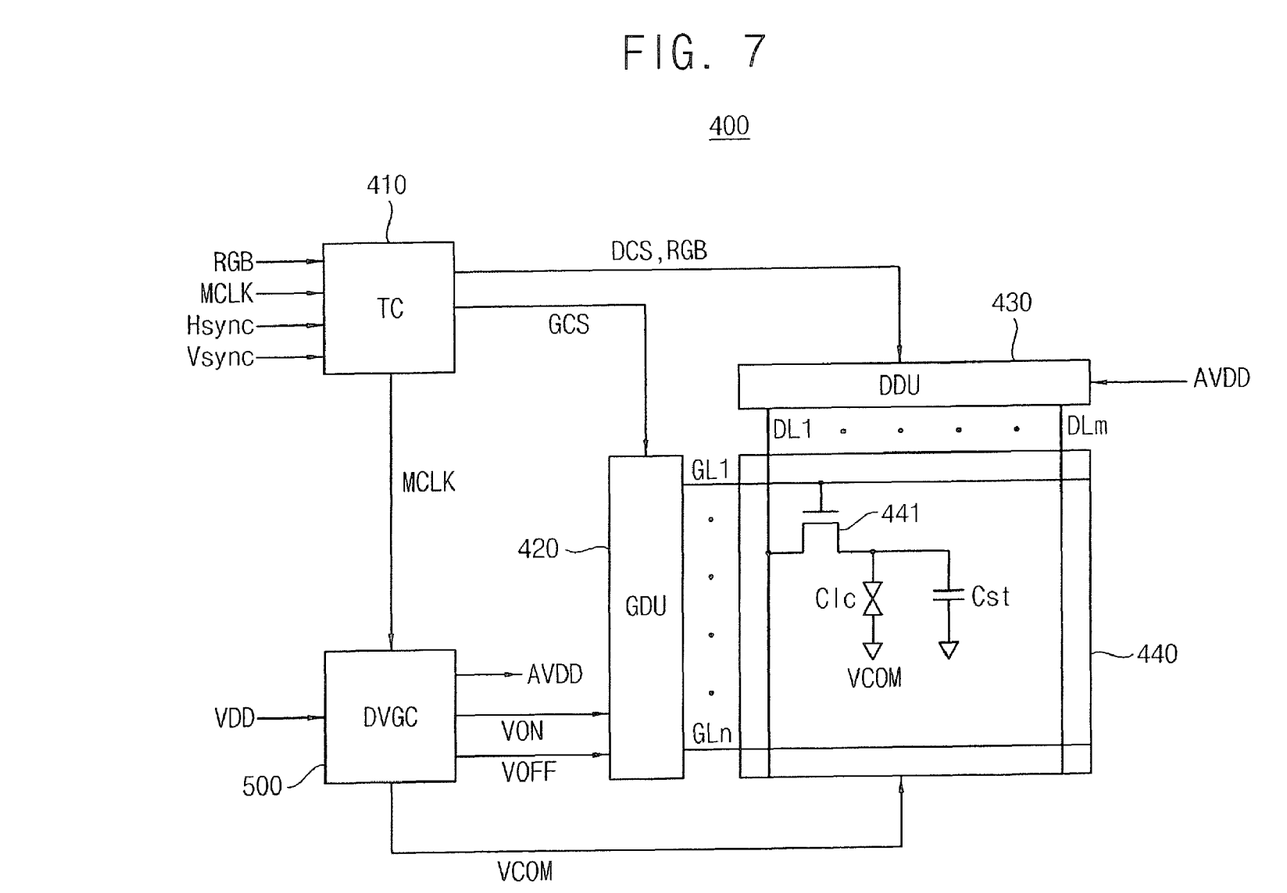
FIG. 7 is a block diagram illustrating a driving voltage generation circuit and a LCD device including the driving voltage generation circuit according to some example embodiments.

FIG. 7 is a block diagram illustrating a driving voltage generation circuit and a LCD device including the driving voltage generation circuit according to some example embodiments. Referring to FIG. 7, a LCD device 400 includes a timing controller (TC) 410, a gate line driving unit (GDU) 420, a data line driving unit (DDU) 430, a LCD panel 440, and a driving voltage generation circuit (DVGC) 500.

The LCD panel 440 includes a plurality of data lines DL1~DLm, a plurality of gate lines GL1~GLn, and TFT transistors coupled to each of the data lines DL1~DLm and the gate lines GL1~GLn. For convenience of illustration, only one pixel including TFT transistor 441 is illustrated in FIG. 7, which is coupled to the data line DL1 and the gate line GL1. The TFT transistor 441 is coupled to a liquid crystal capacitor Clc and a storage capacitor Cst.

The timing controller 410 receives, from an external graphic controller (not illustrated), RGB data, horizontal sync signals Hsync, vertical sync signals Vsync, and a main clock signal MCLK. The timing controller 410 generates a gate control signal GCS for controlling the GDU 420, and a data control signal DCS for controlling the DDU 430 based on the horizontal sync signals Hsync, the vertical sync signals Vsync, and the main clock signal MCLK. The gate control signal GCS may include a gate start pulse (GSP), a gate shift clock (GSC), and a gate output signal (GOE). The data control signal DCS may include a source start pulse (SSP), a source shift clock (SSC), a source output enable (SOC), and a polarity signal (POL).

The timing controller 410 provides the main clock signal MCLK to the DVGC 500, and the DVGC 500 generates a plurality of driving voltages based on the main clock signal MCLK. The plurality of driving voltages may include a reference voltage AVDD applied to the DDU 430, a gate on voltage VON and a gate off voltage VOFF applied to the GDU 420, and a common voltage VCOM applied to a common electrode of the liquid crystal capacitor Clc.

The DDU 430 generates analog gray voltages corresponding to digital video data (RGB data) from the reference voltage AVDD, in response to the data control signal DCS, and provides the generated analog gray voltages to the data lines DL1~DLm.

The GDU 420 provides sequentially a scan pulse, which correspond to the gate on voltage VON or the gate off voltage VOFF, to the gate lines GL1~GLn, to turn on the TFT 414 coupled to each of the gate lines GL1~GLn. The gray scale voltages provided to the data lines DL1~DLm are applied to corresponding pixels.

Figure 8:
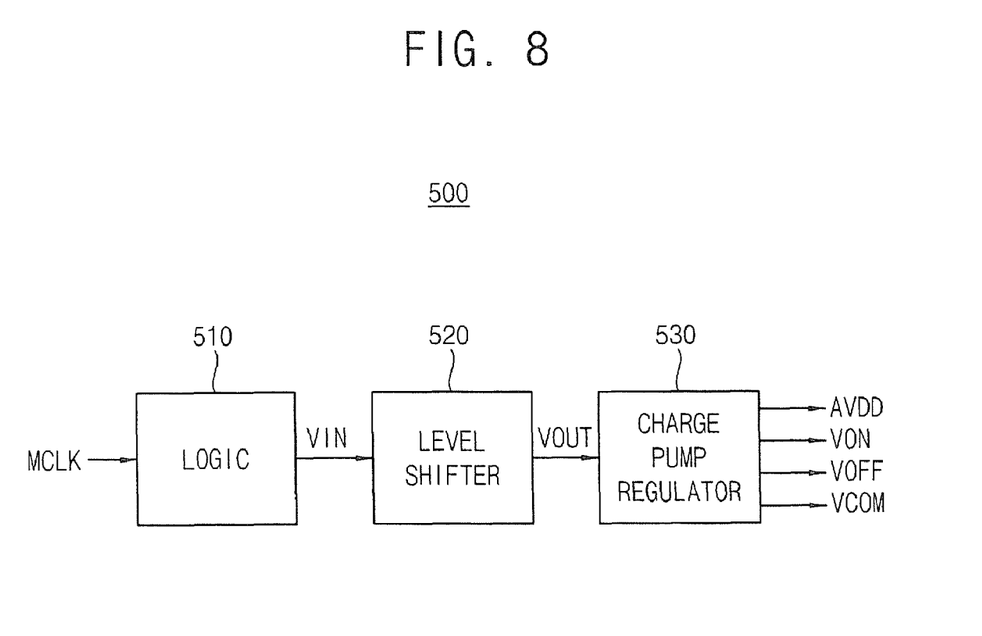
FIG. 8 is a block diagram illustrating a DVGC included in the LCD device of FIG. 7.

FIG. 8 is a block diagram illustrating a DVGC included in the LCD device of FIG. 7.

Referring to FIG. 7, a DVGC 500 includes a logic unit 510, a level shifting circuit 520, and a charge pump regulator 530.

The logic unit 510 provides an input signal VIN based on the main clock signal MCLK from the timing controller 410. The input signal VIN may be a pulse-shaped signal that has a same voltage level as the main clock signal MCLK. The input signal VIN and the main clock signal MCLK have different activation periods with respect to each other. The logic unit 510 may include logic elements such as flip-flops.

The level shifting circuit 520 shifts a voltage level of the input signal VIN to provide an output signal VOUT. The level shifting circuit 520 may include one of level shifting circuits of FIGS. 1, 3, and 5.

The charge pump regulator 530 generates a plurality of driving voltages including the reference voltage AVDD, the gate on voltage VON, the gate off voltage VOFF, and the common voltage VCOM.

Figure 9:
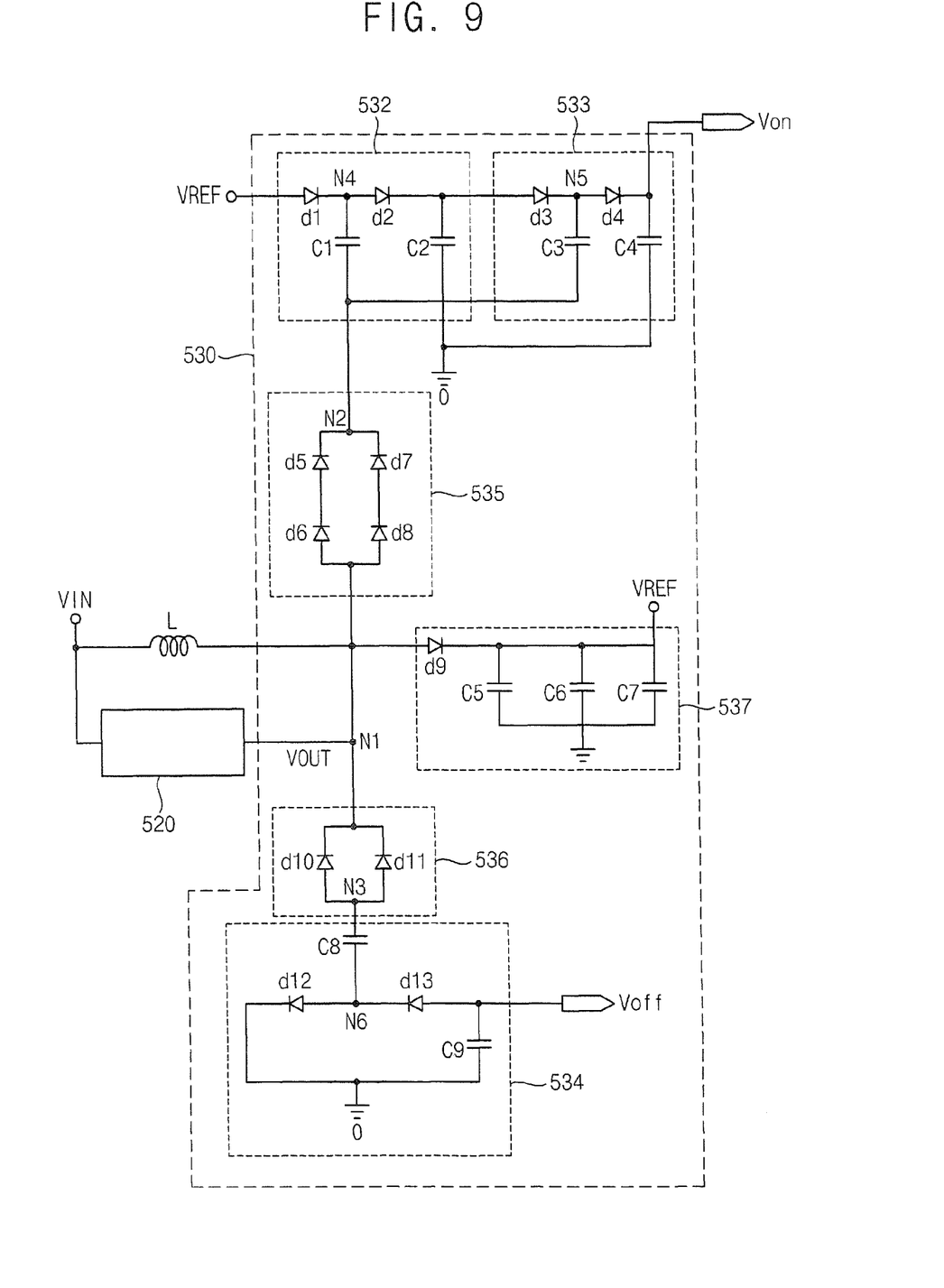
FIG. 9 is a circuit diagram illustrating a level shifting circuit and a charge pump regulator included in the DVGC of FIG. 8.

FIG. 9 is a circuit diagram illustrating a level shifting circuit and a charge pump regulator included in the DVGC of FIG. 8. In FIG. 9, the input voltage swings between GND and VDD, and the output voltage swings between GND and VGH when the level shifting circuit 520 employs the level shifting circuit 100 of FIG. 1. VDD may have a level of about 3.3[V], and VGH may have a level of about 10[V].

Referring to FIG. 9, the charge pump regulator 530 includes diode units 535 and 536 coupled in parallel to the level shifting circuit 520, a reference voltage generation circuit 537, a plurality of charge pump circuits 532, 533, and 534 coupled to the diode units 535 and 536.

The diode unit 535 includes two pairs of diodes d5~d8 connected in parallel between a node N1 and a node N2 and disposed in a forward direction and a backward direction, and the diode unit 536 includes a pair of diodes d10 and d11 connected in parallel between the node N1 Ana a node N3 and disposed in a forward direction and a backward direction.

Each of the charge pump circuits 532, 533, and 534 includes two diodes and two capacitors.

One end of a capacitor C1 of the charge pump circuit 532 is connected to a contact point between two diodes d1 and d2 and the other end is connected to the node N2, and one end of a capacitor C2 of the charge pump circuit 532 is connected to a contact point between two diodes d2 and d3 and the other end is connected to a ground voltage. Likewise, one end of a capacitor C3 of the charge pump circuit 533 is connected to a contact point between two diodes d3 and d4 and the other end is connected to the node N2, and one end of a capacitor C4 of the charge pump circuit 533 is connected to a gate-on voltage output terminal Von and the other end is connected to the ground voltage. In addition, one end of a capacitor C8 of the charge pump circuit 534 is connected to the node N3, and the other end is connected to a contact point between two diodes d12 and d13, and one end of a capacitor C9 of the charge pump circuit 534 is connected to a gate-off voltage output terminal Voff and the other end is connected to the ground voltage. The reference voltage generation circuit 537 includes three capacitors C5~C7 commonly coupled to the node N1 via the diode d9. An inductor L connected between the input signal VIN and the node N1 prevents currents from varying rapidly.

Hereinafter, operation of the charge pump regulator 530 will be described. In this case, the gate-on voltage VON and the gate-off voltage VOFF used for a display device are 22V and −7.5V respectively, and similar values as an example will be described.

First, a process of generating gate-on voltage VON will be described. It is assumed that each of the diodes d1~d3 has a threshold voltage of 0.7V.

When the level shifting circuit 520 applies 0V to the node N1, the reference voltage generation unit 537 generates a reference voltage VREF of 0V and the reference voltage is connected to an anode terminal of the diode d1 of the charge pump circuit 532. A voltage of the node is 0V, and then a voltage at the node N2 1.4 V passed through two diodes d7 and d8 disposed in a backward direction. Meanwhile, a voltage at a node N4 between two diodes d1 and d2 is 0V as well, and a voltage over the capacitor C1 is −1.4V with respect to the node N4.

Subsequently, a voltage of 10V is applied to the node N1, and then the voltage of the node N2 is changed to 8.6V due to a forward current, and thus a voltage at a node N4 becomes 7.2V which is the sum of the voltage over the capacitor C1 and the voltage of the node N2. The reference voltage VREF from the reference voltage generation unit 537 is also 10V, which is changed to 9.3V due to a voltage drop of 0.7V passing through the diode d1, and then a final voltage at the node N2 becomes 16.5V by adding 9.3V to 7.2V. In this case, it is assumed that there is no voltage drop across the diode d9 between the reference voltage VREF and the node N1 for calculative convenience. Additionally, a voltage over the capacitor C2 becomes 15.8V due to a voltage drop of 0.7V when passing through the diode d2, and a voltage at one end of the capacitor C3, i.e., a voltage at a node N5, becomes 15.1V when passing through the diode d3 once more.

Then, application of 0V to the node N1 changes a voltage at a node N2 to 1.4V, and a voltage over the capacitor C3 becomes 13.7V which is difference of the voltage at the node N5 and the voltage at the node N2. Next, when the voltage of the node N2 becomes 9.6V, a voltage at the node becomes 22.3V which is the sum of 8.6V and 13.7V corresponding to a voltage over the capacitor C3. The voltage at the node N5 passes through the diode to be 21.6V which is a gate-on voltage VON. Thereafter, the diode d4 turns on only when an anode terminal of the diode d4 has a voltage at the node N5 is higher than the gate-on voltage VON and the diode d4 turns off when a cathode terminal, i.e., the gate-on voltage output terminal Von, has a higher voltage than the anode terminal, and thus the capacitor C4 maintains a floating state. Accordingly, the gate-on voltage output terminal Von outputs a voltage of 21.6V continuously.

Hereinafter, a process of generating a gate-off voltage VOFF will be described.

At first, when the node N1 is applied with 10V, a current flows through the diode d11, the capacitor C8, and the diode d12 to the ground. A voltage at the node N3 becomes 9.3V and a voltage at a node N6 becomes 0.7V. At this time, a voltage over the capacitor C8 is 8.6V which is a difference of voltages at the nodes N3 and N6.

Subsequently, a voltage of the node N1 becomes 10V again, a current flows in a reverse direction, that is, flows from the ground to the node N1 through the capacitor C9, the diode d13, the capacitor C8, and the diode d10. Thus, a voltage of the node N3 is the sum of the voltage over the capacitor C8 and a voltage at the node N6, and thus becomes −7.2V. Accordingly, a voltage at the gate-off voltage output terminal Voff becomes −7.2V which is the sum of the voltage at the node and the threshold voltage of 0.7V for the diode d13.

When a voltage of the node N1 becomes 10V again, the diode turns off to cause the capacitor C9 to be in a floating state, thereby outputting −7.2V continuously. Alternatively, when a voltage of the node N1 becomes 0V, the gate-off voltage output terminal Voff outputs −7.2V by repeating the above-described procedure.

The gate-on voltage VON and the gate-off voltage VOFF is described for the charge pump regulator 530 with reference to FIG. 9, the common voltage VCOM and the gray-scale reference voltage AVDD as well as the gate-on voltage VON and the gate-off voltage VOFF may be generated by adjusting a number of charge pump circuits and a number of diodes of diode units.

In above-described charge pump regulator 530, it is assumed that the level shifting circuit 520 employs the level shifting circuit 100 of FIG. 1, and the output signal VOUT swings between GND and VGH. Meanwhile, when the level shifting circuit 520 employs the level shifting circuit 200 of FIG. 3, the output signal VOUT swings between VGL and VDD. When the level shifting circuit 520 employs the level shifting circuit 300 of FIG. 5, the output signal VOUT swings between VGL and VGH. Therefore, the charge pump regulator 530 may generate various levels of driving voltages according to voltage levels of the output signal VOUT.

As mentioned above, the example embodiments are widely applicable to display devices such as mobile phones and a PMP that uses power-limited secondary batteries for reducing power consumption in the level shifting circuits that operate at high speed.

Moreover, as described above with respect to FIG. 1, a level shifting circuit 100 can be configured to generate multiple tracking signals VM1, VM2 that are in-phase with an input signal VIN, but are level-shifted with wider swings relative to the input signal. These input tracking signals VM1, VM2 are provided as separate inputs to an inverter 40 having at least one PMOS pull-up transistor 42 and at least one NMOS pull-down transistor 44 therein. This level shifting circuit 100 also includes a differential input circuit (10, 20) formed by NMOS transistors 12 and 22, which is responsive to true and complementary input signals VIN and /VIN (generated by inverter 50). A first load circuit 30 is electrically coupled to the differential input circuit (10, 20). This first load circuit 30 is configured to generate first and second tracking signals VM1 and VM2 at respective first and second nodes therein. These first and second nodes are illustrated as node N3 and node N2 in FIG. 1. As illustrated by FIG. 2, the first and second tracking signals are in-phase, level-shifted versions of each other, and have respective voltage swings ((VGH-to-Vtp), ((VGH−Vtp)-to-GND)) that are greater than a voltage swing (GND-to-Vdd) of the complementary input signals (VIN, /VIN). The inverter 40 has a pull-up transistor 42 therein that is responsive to the first tracking signal VM1 and a pull-down transistor 44 responsive to the second tracking signal VM2.

The differential input circuit (10, 20) includes first and second input transistors 12, 22 having gate terminals responsive to the true and complementary input signals VIN, /VIN, as illustrated. The first load circuit 30 may include first and second pairs of cross-coupled load transistors electrically connected to drain terminals of the first and second input transistors 12, 22 in the differential input circuit 10, 20. The first pair of cross-coupled load transistors includes a totem pole arrangement of a first load transistor 31 configured as a diode and a second load transistor 33 having a drain terminal connected to a source terminal of the first load transistor 31. The second pair of cross-coupled load transistors may include a totem pole arrangement of a third load transistor 32 configured as a diode and a fourth load transistor 34 having a drain terminal connected to a source terminal of the third load transistor 32. According to this configuration, the gate terminals of the first and fourth load transistors 31, 34 are electrically connected together and the gate terminals of the second and third load transistors 32, 33 are electrically connected together. Moreover, the inverter 40 may include a pull-down transistor 44 responsive to the second tracking signal VM2. As will be understood by those skilled in the art, the electrical dual of the level shifting circuit 100 of FIG. 1 is illustrated as the level shifting circuit 200 of FIG. 3.

According to the embodiment of the invention illustrated by FIG. 5, a second load circuit is provided in addition to the first load circuit. This second load circuit is electrically coupled to the differential input circuit, which includes NMOS transistors 311 and 312 and PMOS transistors 321 and 322. The second load circuit is configured to generate third and fourth tracking signals at respective third and fourth nodes therein. These third and fourth nodes are illustrated as node N2 in FIG. 5 and the node at the drain terminal of NMOS transistor 323. These third and fourth tracking signals, which are in-phase, level-shifted versions of each other, have respective voltage swings that are greater than a voltage swing of the complementary input signals VIN, /VIN. In the event the second load circuit of FIG. 5 is provided, then the inverter may include a pull-up transistor 331 responsive to tracking signal VM1 and a pull-down transistor 332 responsive to the third tracking signal VM2. The second load circuit, which is electrically coupled to the differential input circuit, may have a complementary configuration relative to the first load circuit. Based on this complementary configuration, the first load circuit may consist of two pairs of PMOS transistors (see, e.g., PMOS transistors 313-316) and the second load circuit may consist of two pairs of NMOS transistors (see, e.g., NMOS transistors 323-326).

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present invention. Accordingly, all such modifications are intended to be included within the scope of the present invention as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A level shifting circuit, comprising:
   a differential input circuit responsive to true and complementary input signals, said differential input circuit comprising first and second input transistors having gate terminals responsive to the true and complementary input signals, respectively;
   a first load circuit electrically coupled to said differential input circuit, said first load circuit configured to generate first and second tracking signals at respective first and second nodes therein that are in-phase level-shifted versions of each other and have respective voltage swings that are greater than a voltage swing of the true input signal, said first load circuit comprising first and second pairs of cross-coupled load transistors electrically connected to drain terminals of the first and second input transistors in said differential input circuit; and
   an inverter having a pull-up transistor therein responsive to the first tracking signal;

wherein the first pair of cross-coupled load transistors comprises a totem pole arrangement of a first load transistor configured as a diode and a second load transistor having a drain terminal connected to a source terminal of the first load transistor;

wherein the second pair of cross-coupled load transistors comprises a totem pole arrangement of a third load transistor configured as a diode and a fourth load transistor having a drain terminal connected to a source terminal of the third load transistor; and wherein gate terminals of the first and fourth load transistors are electrically connected together; and wherein gate terminals of the second and third load transistors are electrically connected together.

2. The level shifting circuit of claim 1, wherein said inverter comprises a pull-down transistor responsive to the second tracking signal.

3. The level shifting circuit of claim 1, wherein said inverter comprises a pull-down transistor responsive to the second tracking signal; and wherein first and second tracking signals are generated at the source and drain terminals of the first load transistor, respectively.

4. The level shifting circuit of claim 1, further comprising a second load circuit electrically coupled to said differential input circuit, said second load circuit configured to generate third and fourth tracking signals at respective third and fourth nodes therein that are in-phase level-shifted versions of each other and have respective voltage swings that are greater than a voltage swing of the true input signal.

5. The level shifting circuit of claim 4, wherein said inverter comprises a pull-down transistor responsive to the third tracking signal.

6. The level shifting circuit of claim 1, further comprising a second load circuit electrically coupled to said differential input circuit, said second load circuit having a complementary configuration relative to said first load circuit.

7. The level shifting circuit of claim 6, wherein said first load circuit consists of two pairs of PMOS (or NMOS) transistors and said second load circuit consisting of two pairs of NMOS (or PMOS) transistors.

8. The level shifting circuit of claim 1, further comprising a charge pump regulator responsive to an output signal generated by said inverter.

9. The level shifting circuit of claim 1, wherein the first and second input transistors are NMOS transistors; and wherein said differential input circuit further comprises a pair of PMOS input transistors responsive to the true and complementary input signals.

10. The level shifting circuit of claim 9, further comprising a second load circuit electrically coupled to the pair of PMOS input transistors.

* * * * *